(12) United States Patent
Zhang et al.

(10) Patent No.: US 12,152,301 B1
(45) Date of Patent: Nov. 26, 2024

(54) METHOD FOR SYNTHESIZING 2H/1T' TMD HETEROPHASE JUNCTIONS AND A DEVICE BASED ON THE SAME

(71) Applicant: City University of Hong Kong, Hong Kong (HK)

(72) Inventors: Hua Zhang, Hong Kong (HK); Yongji Wang, Hong Kong (HK); Wei Zhai, Hong Kong (HK)

(73) Assignee: City University of Hong Kong, Hong Kong (HK)

( * ) Notice: Subject to any disclaimer, the term of this patent is extended or adjusted under 35 U.S.C. 154(b) by 25 days.

(21) Appl. No.: 18/320,991

(22) Filed: May 21, 2023

(51) Int. Cl.
*C23C 16/455* (2006.01)
*C23C 16/52* (2006.01)

(52) U.S. Cl.
CPC ........ *C23C 16/45523* (2013.01); *C23C 16/52* (2013.01)

(58) Field of Classification Search
None
See application file for complete search history.

(56) References Cited

PUBLICATIONS

Liu, L. et al. "Phase-selective synthesis of 1T' MoS2 monolayers and heterophase bilayers". Nat. Materials. 17, pp. 1108-1114 (2018). (Year: 2018).*

Rajesh Kappera et al., Phase-engineered low-resistance contacts for ultrathin MoS2 transistors, Nature Materials, 2014, 13, 1128-1134.
Suyeon Cho et al., Phase patterning for ohmic homojunction contact in MoTe2, Science, 2015, 349, 625-628.
Zhuangchai Lai et al., Metastable 1T'-phase group VIB transition metal dichalcogenide crystals, Nature Materials, 2021, 20, 1113-1120.
Lina Liu et al., Phase-selective synthesis of 1T' MoS2 monolayers and heterophase bilayers, Nature Materials, 2018, 17, 1108-1114.
X. Lin et al., Intrinsically patterned two-dimensional materials for selective adsorption of molecules and nanoclusters, Nature Materials, 2017, 16, 717-721.

(Continued)

*Primary Examiner* — Alexander M Weddle
(74) *Attorney, Agent, or Firm* — Idea Intellectual Limited; Margaret A. Burke; Sam T. Yip

(57) ABSTRACT

Provided is a method for synthesizing 2H/1T' transition metal dichalcogenide (TMD) heterophase junctions. Synthesis of vertical 2H/1T' $MoS_2$ heterophase junction is achieved by growing 2H $MoS_2$ monolayers on a mica substrate under pure Ar carrier gas, and then growing 1T' $MoS_2$ nanoribbons on top of the 2H $MoS_2$ monolayers by changing the carrier gas from pure Ar to a mixture of Ar and $H_2$ gases. The integrated devices based on 2H/1T' $MoS_2$ heterophase structures display typical rectifying behavior with a current rectifying ratio of over 102 and achieve a responsivity of 1.07 A/W at 532 nm with an ultra-low dark current of lower than 10-11 A. These superior features make 2H/1T' $MoS_2$ heterophase structure a promising candidate for future rectifiers as well as photodetectors. More importantly, the provided synthesis method can pave the way toward tailoring the phase in $MoS_2$ to promote the performance of electronic devices.

14 Claims, 23 Drawing Sheets

Stage 1

(56) References Cited

PUBLICATIONS

Yu Zhang et al., Edge-Epitaxial Growth of 2D NbS2-WS2 Lateral Metal-Semiconductor Heterostructures, Adv. Mater. 2018, 30, 1803665.

Jiajing Wu et al., Solution Processing for Lateral Transition-Metal Dichalcogenides Homojunction from Polymorphic Crystal, J. Am. Chem. Soc. 2019, 141, 592-598.

Ji Ho Sung et al., Coplanar semiconductor-metal circuitry defined on few-layer MoTe2 via polymorphic heteroepitaxy, Nature Nanotechnology, 2017, 12, 1064-1070.

* cited by examiner

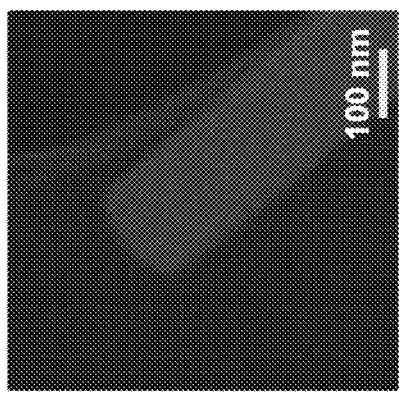
FIG. 8
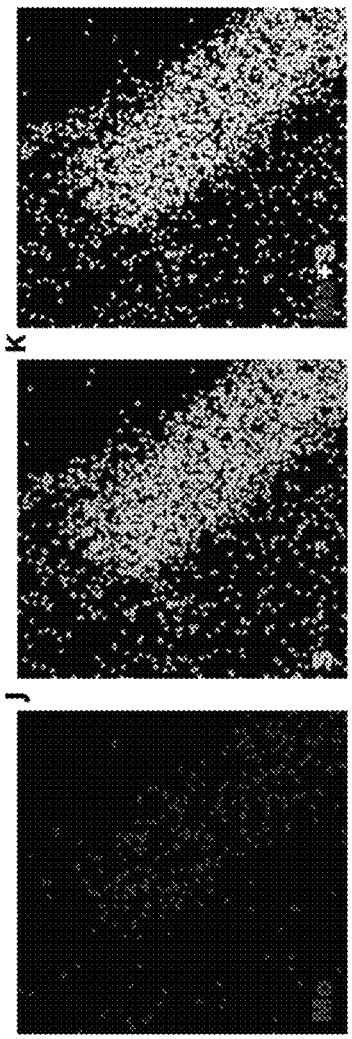
FIG. 9A
FIG. 9B
FIG. 9C

METHOD FOR SYNTHESIZING 2H/1T' TMD HETEROPHASE JUNCTIONS AND A DEVICE BASED ON THE SAME

FIELD OF THE INVENTION

The present invention generally relates to transition metal dichalcogenide (TMD) heterophase junctions. More specifically, the present invention relates to a chemical vapour deposition (CVD) method for growing 2H/1T' $MoS_2$ heterophase junctions.

BACKGROUND OF THE INVENTION

Two-dimensional (2D) TMDs have attracted much interest due to their diverse properties ranging from insulators, semiconductors, semi-metals, to true metals. When different 2D materials are stacked vertically, the advantages of multiple materials can be combined. With the development of phase engineering of nanomaterials (PEN), crystal phase of TMDs has become one of the most important structural features beyond size, morphology, and symmetry, which determines the intrinsic properties of TMDs. Unlike thermodynamically stable phases, plenty of unconventional phases exhibit distinct properties.

For example, 2H $MoS_2$ typically shows a semiconducting feature, while 1T and 1T' $MoS_2$ normally display the metallic characteristic. Heterojunctions, especially heterophase junctions, have gained more attention since they can act as high-performance devices such as rectifiers, detectors and transistors for energy storage, electrocatalysis as well as optoelectronics. Many works have indicated that the coexistence of semiconducting and metallic polymorphs in 2D heterophase junctions is extremely significant to improve carrier mobility, thereby improving the overall performance of the device.

1T' $MoS_2$ has a semi-metallic phase with high electrical conductivity and shows a lower contact barrier with 2H $MoS_2$ compared to metal-contacted 2H $MoS_2$. Herein, by precise controlling of synthesis conditions, the in situ growth of 2H/1T' $MoS_2$ heterophase junctions was realized. The prepared junctions show clean van der Walls interfaces, which facilitates the fast photo response time and high photoresponsivity.

However, existing methods for obtaining $MoS_2$ heterophase junctions are usually based on manual stacking and local phase transformation, which will inevitably introduce contaminants and interface defects. Moreover, existing approaches of mass production for $MoS_2$ heterophase junctions strongly rely on post-treatments, such as laser irradiation, lithium intercalation, chemical doping which reaction conditions are complex and harsh, and controllability is poor. Direct epitaxial (or in-situ) growth of metastable 1T' $MoS_2$ on 2H $MoS_2$ heterophase junction with high purity and a clear van der Waals interface is still quite challenging because the formation energy of 1T' phase is much higher than that of the 2H phase.

SUMMARY OF THE INVENTION

In accordance with a first aspect of the present disclosure, a CVD method for growing 2H/1T' TMD heterophase junction is provided. The method comprises: mixing a transition metal compound powder and a first chalcogen powder to form a first mixture; heating up the first mixture to a first heating temperature in a chemical vapour deposition (CVD) furnace filled with Ar gas; keeping the first mixture at the first heating temperature for a first heating time under a first mixed gas flow of $H_2$ and Ar to form a first precursor; mixing the first precursor with a second chalcogen powder to form a second mixture; heating up the second mixture to a second heating temperature in a CVD furnace filled with Ar gas; keeping the second mixture at the second heating temperature for a second heating time under a second mixed gas flow of $H_2$ and Ar to form a second precursor; placing a substrate on top of the second precursor; heating up the second precursor and the substrate to a growth temperature in a CVD furnace filled with Ar gas; keeping the second precursor and the substrate at the growth temperature for a first growth time under a gas flow of Ar to grow a 2H TMD layer on the substrate; keeping the second precursor and the substrate at the growth temperature for a second growth time under a third mixed gas flow of $H_2$ and Ar to grow a 1T' TMD layer above the grown 2H TMD layer on the substrate; and cooling down rapidly the substrate grown with the 2H/1T' TMD heterophase junctions.

In a further aspect, the method further comprises grinding the first mixture in an agate mortar, transferring the first mixture into a first alumina crucible and placing the first alumina crucible at a center position in the CVD furnace before heating up the first mixture in the CVD furnace.

In a further aspect, the method further comprises transferring the second mixture into a second alumina crucible and placing the second alumina crucible at a center position in the CVD furnace before heating up the second mixture in the CVD furnace.

In a further aspect, the method further comprises transferring the second precursor into a quartz crucible before the substrate being placed on top of the second precursor and placing the quartz crucible at a center position in the CVD furnace before heating up the third mixture in the CVD furnace.

In a further aspect, the substrate is a fluorophlogopite mica substrate or a sapphire substrate.

In a further aspect, a flow rate ratio for $H_2$ to Ar in the first mixed gas flow is equal to 1:9; and the first temperature ranges from 400 to 500° C. and the first heating time ranges from 1 to 2 hours, In a further aspect, a flow rate ratio for $H_2$ to Ar in the second mixed gas flow is equal to 1:9; and the second heating temperature ranges from 400 to 500° C. and the second heating time ranges from 1 to 2 hours. In a further aspect, a flow rate ratio for $H_2$ to Ar in the third mixed gas flow is equal to 2:8; and the growth temperature ranges from 750 to 800° C. and each of the first and second growth times ranges from 4 to 6 minutes.

In a further aspect, the transition metal compound powder is a molybdenum compound powder and both the first and second chalcogen powders are sulfur powders such that the 2H/1T' TMD heterophase junctions grown on the substrate are 2H/1T' molybdenum disulfide heterophase junctions.

In a further aspect, the molybdenum compound powder is a potassium molybdate ($K_2MoO_4$) powder.

In accordance with a second aspect of the present disclosure, 2H/1T' TMD heterophase junction-based device is provided. The 2H/1T' TMD heterophase junction-based device comprises: a substrate; a 2H/1T' TMD heterophase junction deposited on the substrate and including a 1T'-TMD region and a 2H-TMD region; and a pair of electrodes connected to the 1T'-TMD and the 2H-TMD regions respectively.

In a further aspect, the 1T'-TMD region is formed of 1T'-$MoS_2$ crystal and the 2H-TMD region is formed of 2H-$MoS_2$ crystal.

In a further aspect, the substrate is a SiO$_2$/Si substrate.

In a further aspect, the electrodes are made of Cr/Au layer.

It is gratifying that in the synthesized 2H/1T' MoS$_2$ heterophase junction, the grown 1T' MoS$_2$ nanoribbon can extend over the region of 2H MoS$_2$ monolayer, which allows direct fabrication of devices utilizing the as-prepared heterophase junctions without any additional post-treatment process. Therefore, the present invention offers a new strategy in the field of phase engineering, which could also be used for preparation of other heterophase junctions.

In accordance with a second aspect of the present disclosure, a device based on 2H/1T' TMD heterophase junction may be fabricated using the CVD method provided by the present invention. For example, the fabricated 2H/1T' MoS$_2$ heterophase junction-based device displays outstanding behaviors of rectification and exhibits high responsivity and fast raise time, indicating the great potential of 2H/1T' MoS$_2$ heterophase junction in future optoelectronics application. In addition, the 2H/1T' MoS$_2$ heterophase junction can serve as an anisotropic conductor and micro-cell catalyst.

BRIEF DESCRIPTION OF THE DRAWINGS

Embodiments of the invention are described in more details hereinafter with reference to the drawings, in which:

FIG. 8 shows a dark-field HRTEM image of the 2H/1T' MoS$_2$ heterophase junctions;

FIGS. 9A to 9C show elemental mapping images of Mo L signals, S K signals and overlap of Mo L and S K signals for the 2H/1T' MoS$_2$ heterophase junctions, respectively;

DETAILED DESCRIPTION

In the following description, embodiments of the present invention are set forth as preferred examples. It will be apparent to those skilled in the art that modifications, including additions and/or substitutions may be made without departing from the scope and spirit of the invention. Specific details may be omitted so as not to obscure the invention, however, the disclosure is written to enable one skilled in the art to practice the teachings herein without undue experimentation.

In accordance with one aspect of the present invention, a general method for growing 2H/1T' TMD heterophase junctions is provided. The method adopts a one-pot synthesis strategy and comprises three main stages as shown in FIGS. 1A to 1C respectively.

Figure 1A:
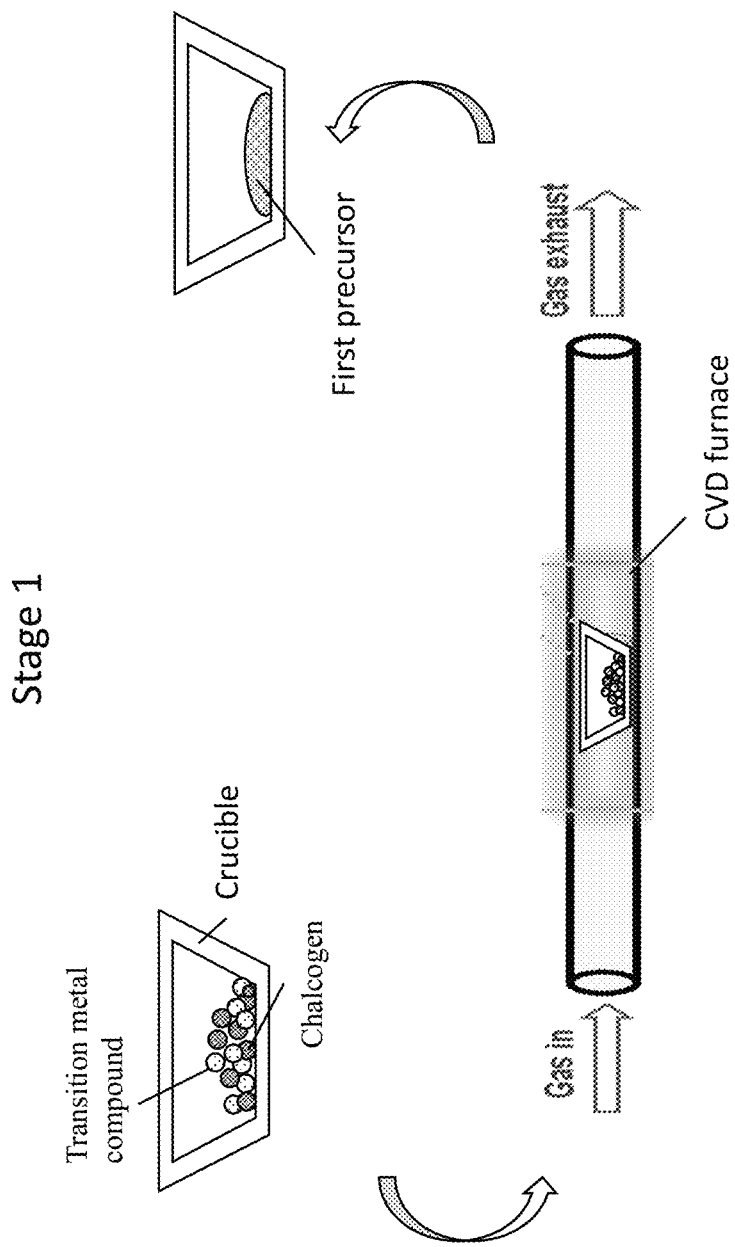
FIGS. 1A to 1C shows three main stages of a general method for growing 2H/1T' TMD heterophase junctions according to some embodiments of the present invention.

Referring to FIG. 1A, in Stage 1, a transition metal compound powder and a first chalcogen powder are mixed to form a first mixture. The first mixture is ground in an agate mortar and then transferred into a first alumina crucible. The first alumina crucible is then placed at a center position in the CVD furnace. After filling the CVD furnace with argon (Ar) gas, the first mixture is heated up to a first heating temperature and then kept at the first heating temperature for a first heating time under a first mixed gas flow of H$_2$ and Ar to form a first precursor. The first precursor is then cooled down to room temperature naturally.

Figure 1B:
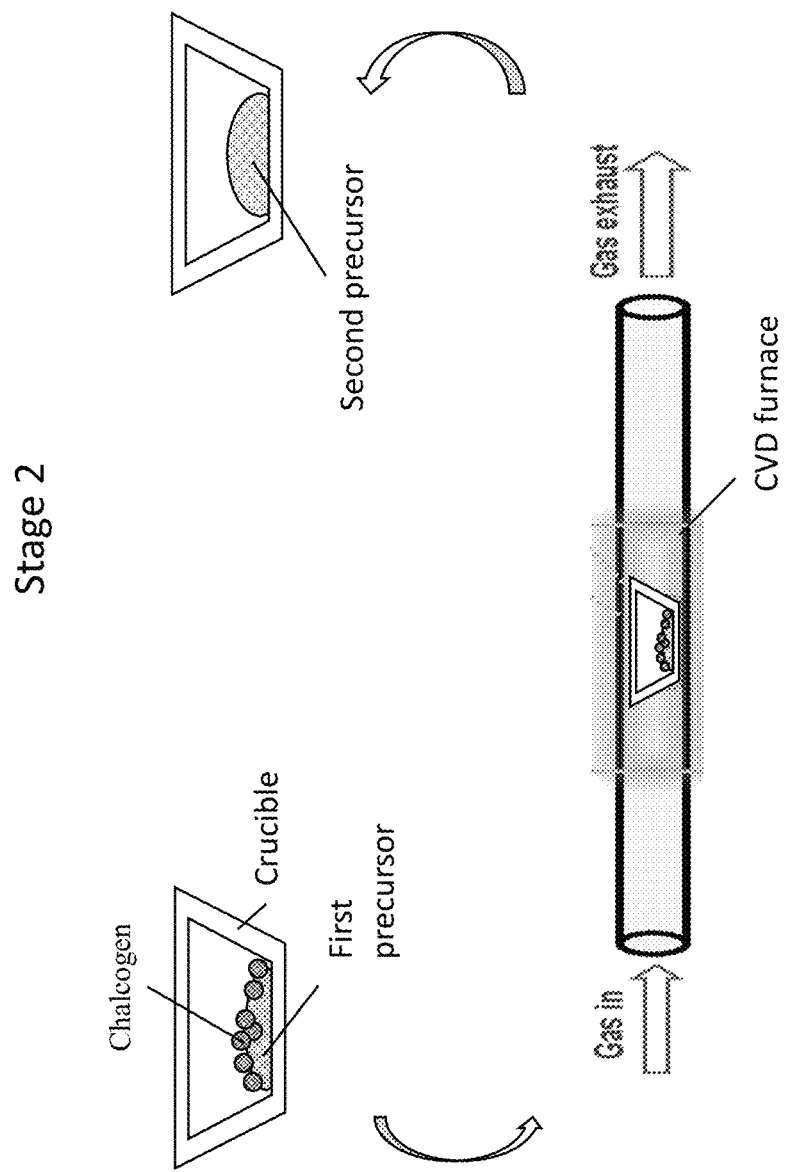

Referring to FIG. 1B, in Stage 2, the first precursor is mixed with a second chalcogen powder to form a second mixture. The second mixture is transferred to a second alumina crucible. The second alumina crucible is then placed at a center position in a CVD furnace. After filling the CVD furnace with Ar gas, the second mixture heated up to a second heating temperature, and then kept at the second heating temperature for a second heating time under a second mixed gas flow of H$_2$ and Ar to form a second precursor. The second precursor is then cooled down to room temperature naturally.

Figure 1C:
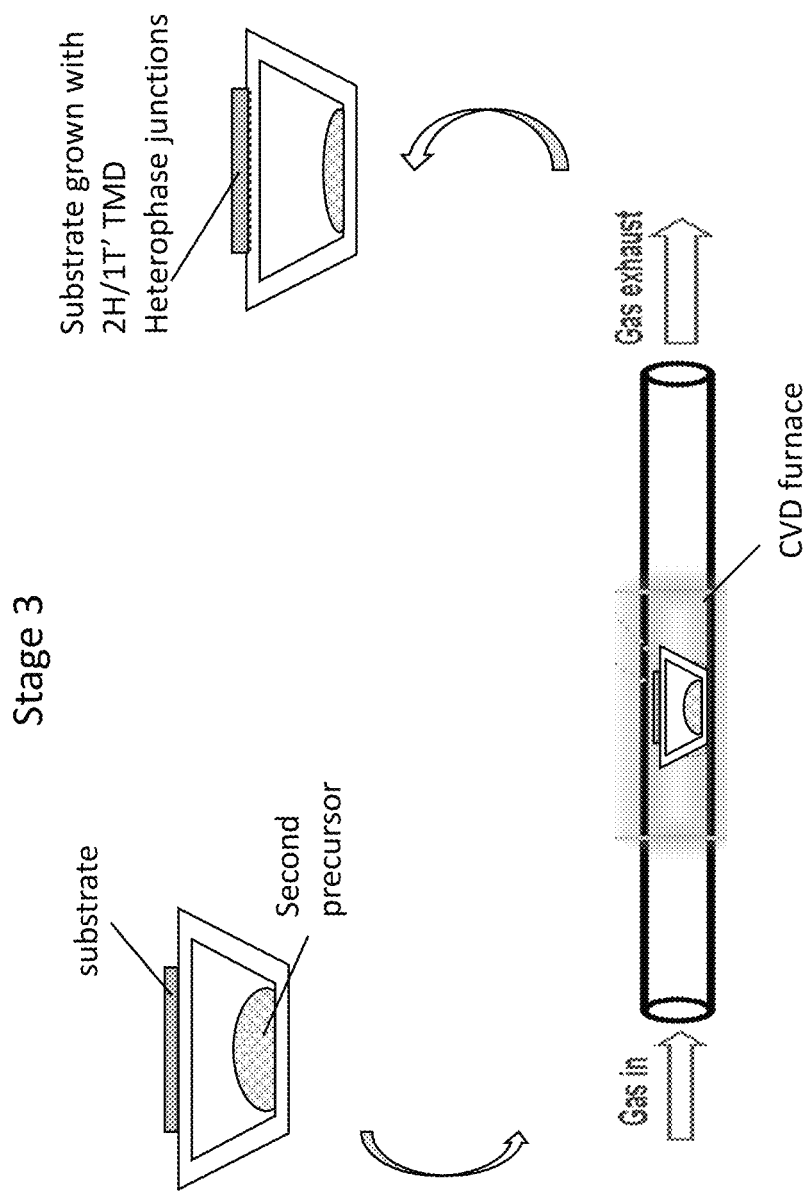

Referring to FIG. 1C, in Stage 3, after the second precursor is loaded into a quartz crucible, one piece of substrate is placed on top of the second precursor. The quartz crucible and the substrate is then placed at a center position in a CVD furnace. After filling the CVD furnace with Ar gas, the second precursor and the substrate is heated up to a first growth temperature, and kept at the first growth temperature for a first growth time under a gas flow of Ar to grow a 2H TMD crystal layer.

Then the second precursor and the substrate are kept at a second growth temperature for a second growth time under a mixed gas flow of $H_2$ and Ar to grow a 1T' TMD layer on the grown 2H TMD layer such that 2H/1T' TMD heterophase junctions are formed. Then the substrate grown with the 2H/1T' TMD heterophase junctions are taken out of the CVD furnace and cooled down rapidly.

Synthesis of 2H/1T' $MoS_2$ Heterophase Junctions

The synthesis of vertical 2H/1T' $MoS_2$ heterophase junction is achieved by simply changing the carrier gas. Briefly, 2H $MoS_2$ monolayers are first grown on a mica substrate under an atmosphere of pure Ar gas. Then, 1T' $MoS_2$ nanoribbons are continuously grown on the top of 2H $MoS_2$ monolayers by changing the carrier gas from pure Ar to a mixture of Ar and hydrogen ($H_2$) gases. leading to the formation of 2H/1T' heterophase junction.

In a typical synthesis, potassium molybdate ($K_2MoO_4$) (600 mg) and sulfur powder (600 mg) were mixed in an agate mortar and then ground for 10 mins. Then the obtained homogeneous mixture was transferred into an alumina crucible and the alumina crucible was placed in the center of the furnace. Subsequently, the quartz tube was vacuumed and refilled with Ar for three times. After purging the tube with Ar (500 s.c.c.m) for 10 mins, the furnace was heated to 450° C. for 1.5 h under a gas flow of $H_2$ (10 s.c.c.m, standard cubic centimeter per minute) and Ar (90 s.c.c.m). After cooling to room temperature, the product was taken out and mixed with sulfur powder (600 mg), afterwards the obtained uniform mixture was loaded into an alumina crucible and then placed in the center of the furnace. Next, the quartz tube was vacuumed and refilled with Ar for three times to remove the air inside the tube. After purging the tube with Ar (500 s.c.c.m) for 10 mins, the furnace was heated to 450° C. for 1.5 h under a gas flow of $H_2$ (10 s.c.c.m) and Ar (90 s.c.c.m). After the reaction was completed, the obtained precursor was taken out when the furnace was naturally cooled to room temperature. Subsequently, 10 mg of the prepared precursor was loaded in a quartz crucible, and one piece of fresh-cleaved fluorophlogopite mica substrate was covered on the top of the precursor. Then the crucible was placed in the center of the furnace. After the quartz tube was vacuumed and refilled with Ar three times, the furnace was heated to 780° C. under a gas flow of Ar (80 s.c.c.m). After that, the tube was purged with $H_2$/Ar mixed gas (20% $H_{2/80}$% Ar) with a flow rate of 100 s.c.c.m. for 5 mins. After the reaction, the furnace power was turned off and the furnace was quickly moved out of the heating zone. Finally, the as-grown 2H/1T' $MoS_2$ heterophase junctions on the mica substrate were prepared.

Characterization of 2H/1T' $MoS_2$ Heterophase Junctions

Figure 2A:
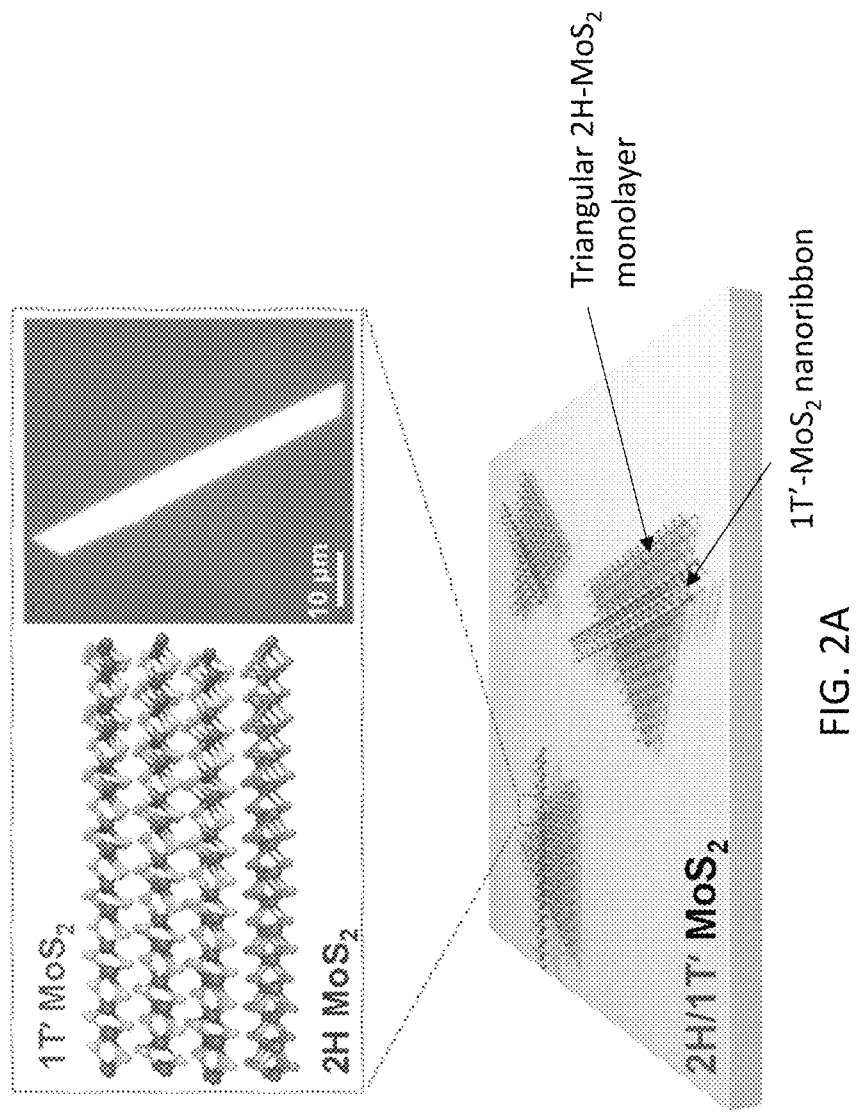
FIG. 2A shows a schematic diagram and a typical optical image (insert of FIG. 2A) of the prepared 2H/1T' MoS$_2$ heterophase junctions.
Figure 2C:
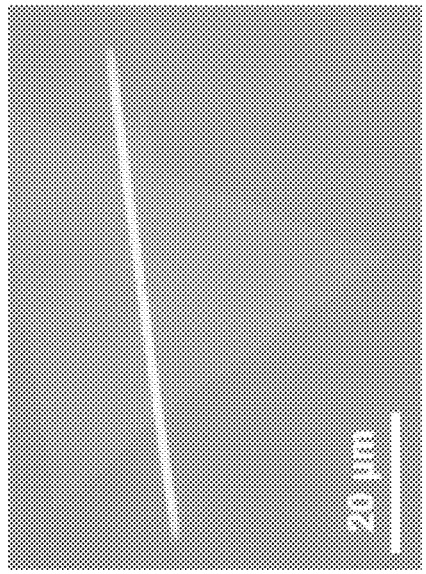
FIGS. 2B and 2C show other optical images of the synthesized 2H/1T' MoS$_2$ heterophase junctions in different scales.
Figure 2B:
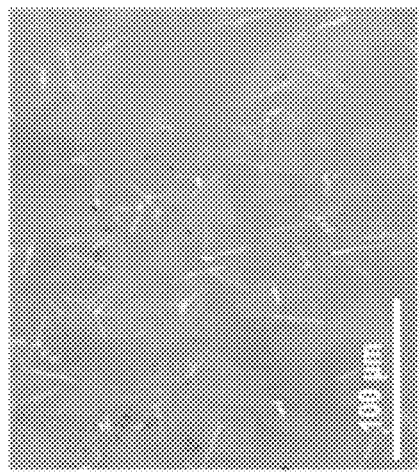

FIG. 2A shows a schematic diagram and a typical optical image (insert of FIG. 2A) of the prepared 2H/1T' $MoS_2$ heterophase junctions, where the top 1T' $MoS_2$ and the bottom 2H $MoS_2$ can be clearly distinguished from their optical contrast. FIGS. 2B and 2C show other optical images of the synthesized 2H/1T' $MoS_2$ heterophase junctions in different scales. The heterophase junctions consisting of triangular 2H $MoS_2$ monolayers and 1T' $MoS_2$ nanoribbons.

The 1T' $MoS_2$ nanoribbon can be synthesized beyond the size of 2H $MoS_2$, which can allow us to fabricate the device directly based on the grown heterophase junctions and thereby avoid redundant processing steps that may damage the material. Moreover, the one-pot synthesis strategy only utilizes a single solid source and hence avoids the interface contamination compared to the traditional two-step route.

Figure 3A:
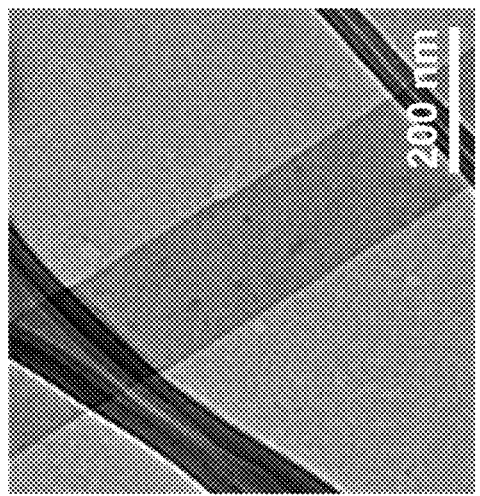
FIGS. 3A and 3B show transmission electron microscope (TEM) images of the prepared 2H/1T' MoS$_2$ heterophase junctions.
Figure 3B:
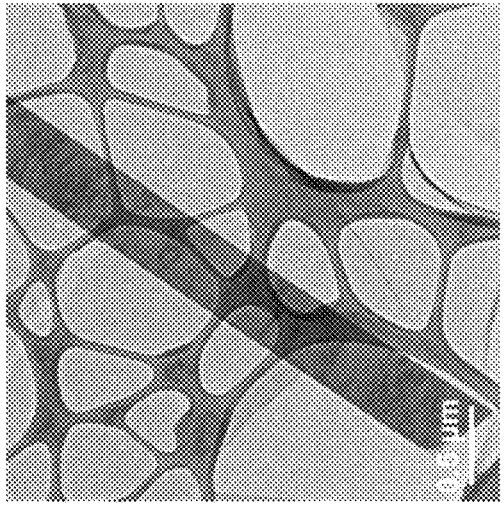
Figure 4:
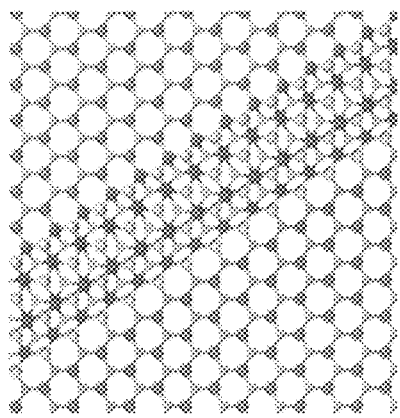
FIG. 4 shows a schematic diagram of the prepared 2H/1T' MoS$_2$ heterophase junctions.

FIGS. 3A and 3B show transmission electron microscope (TEM) images of the prepared 2H/1T' $MoS_2$ heterophase junctions. The morphology of 2H/1T' $MoS_2$ heterophase junctions are consistent with the schematic diagram as shown in FIG. 4.

Figure 5:
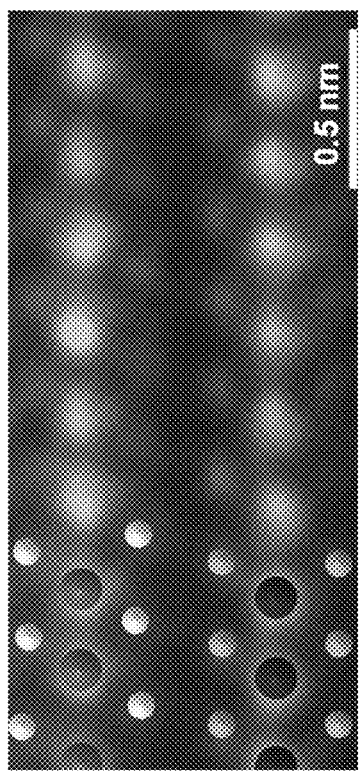
FIG. 5 shows the aberration-corrected high-angle annular dark-field (HAADF) scanning transmission electron microscopy (STEM) cross-section image of the prepared 2H/1T' MoS$_2$ heterophase junctions.

As shown in FIG. 5, the aberration-corrected high-angle annular dark-field (HAADF) scanning transmission electron microscopy (STEM) cross-section image of the prepared 2H/1T' $MoS_2$ heterophase junctions exhibits clear atomic boundaries along the heterophase interface without any obvious atomic mixing or defects.

Figure 6B:
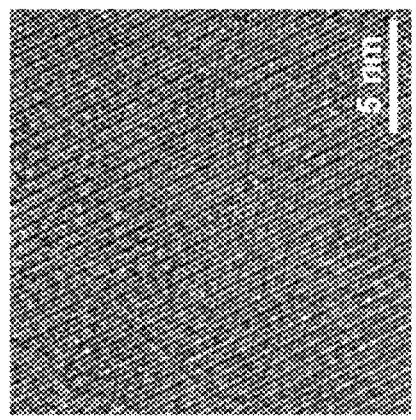
FIGS. 6A and 6B show high-resolution (HR) TEM images of the 2H MoS$_2$ and 1T' MoS$_2$ regions respectively.
Figure 6A:
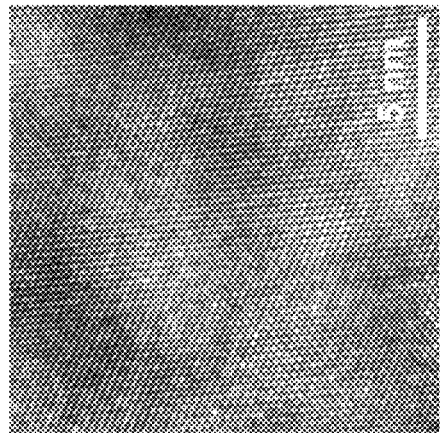
Figure 7B:
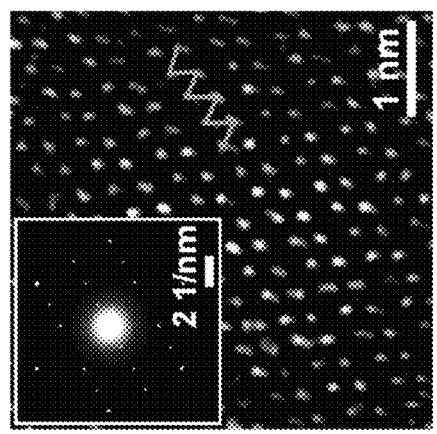
FIGS. 7A and 7B show atomically resolved HAADF-STEM images of the 2H MoS$_2$ and 1T' MoS$_2$ respectively; insets of FIGS. 7A and 7B show selected area electron diffraction (SAED) pattern of the 2H MoS$_2$ and 1T' MoS$_2$ regions respectively.
Figure 7A:
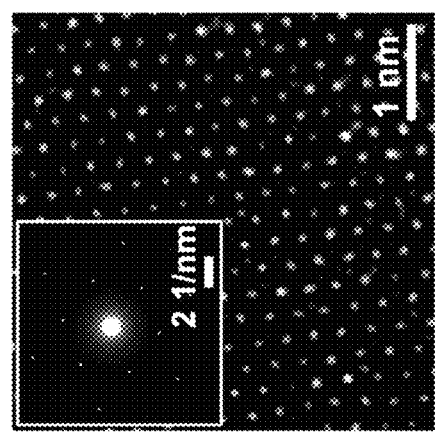

Referring to FIGS. 6A and 6B, high-resolution (HR) TEM images of 2H $MoS_2$ (FIG. 6A) and 1T' $MoS_2$ (FIG. 6B) clearly show the obviously different atomic structures between distorted octahedral 1T' and trigonal prismatic 2H phases. This feature is more apparent in the atomically resolved HAADF-STEM images of the 2H $MoS_2$ in FIG. 7A and 1T' $MoS_2$ in FIG. 7B. The 1T' $MoS_2$ presents clear zigzag chains which is consistent with previous literatures. Moreover, in comparison with the hexagonal symmetry spots shown in the selected area electron diffraction (SAED) pattern of 2H $MoS_2$ (Inset of FIG. 7A), 1T' $MoS_2$ exhibits periodic spots with a rectangular symmetry (Inset of FIG. 7B).

FIG. 8 shows a dark-field HRTEM image of the 2H/1T' $MoS_2$ heterophase junctions. FIGS. 9A to 9C show elemental mapping images of Mo L signals, S K signals and overlap of Mo L and S K signals for the 2H/1T' $MoS_2$ heterophase junctions, respectively. As shown, the signals of Mo and S are uniformly distributed in the 2H/1T' $MoS_2$ heterophase junctions. These results confirm that the 2H/1T' $MoS_2$ heterophase junctions have high purity, good crystallinity and well-defined heterophase boundary.

Figure 10:
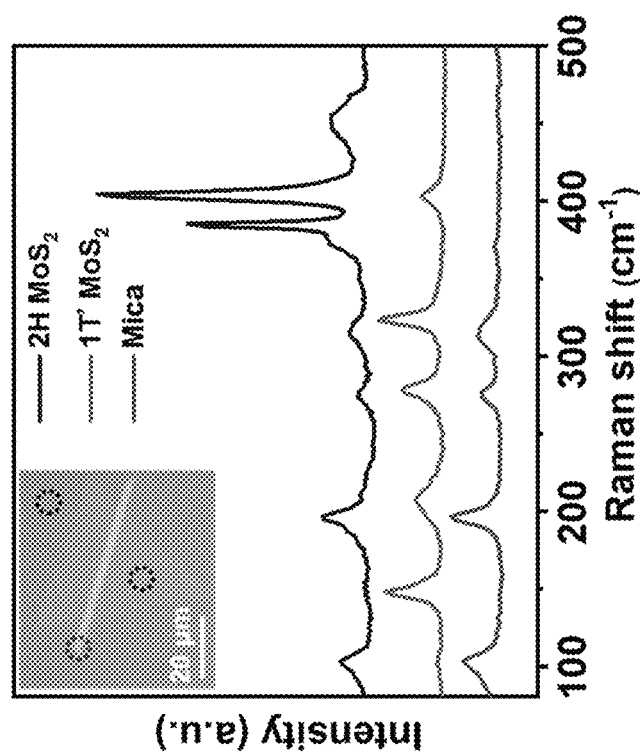
FIG. 10 shows Raman spectra of 2H MoS$_2$ layer, 1T' MoS$_2$ layer, and mica substrate.
Figure 11A:
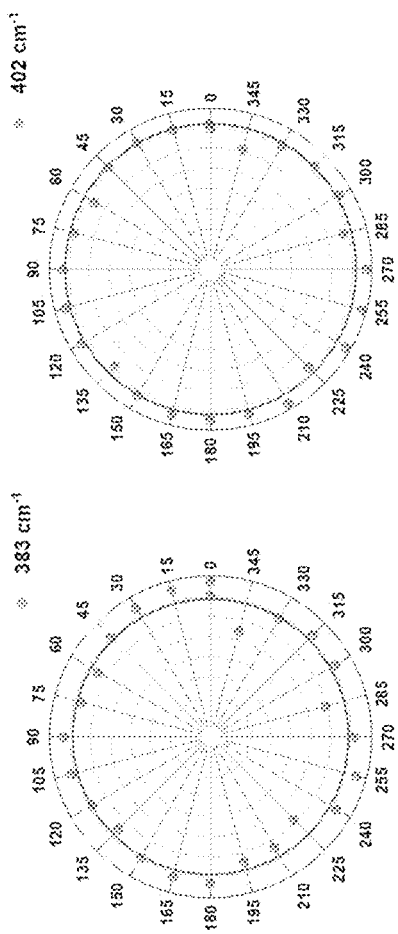
FIGS. 11A and 11B show the angle-dependent Raman intensities of 2H MoS$_2$ and 1T' MoS$_2$ regions respectively.
Figure 11B:
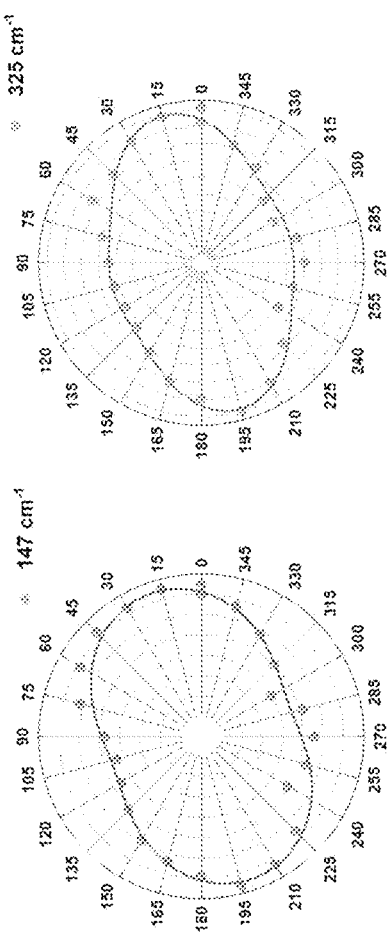

FIG. 10 shows Raman spectra of 2H $MoS_2$, 1T' $MoS_2$, and mica substrate. A typical optical image of the 2H/1T' $MoS_2$ heterophase junctions is shown in the inset of FIG. 10. As shown, different from the two typical Raman peaks (385 and 404 cm-1) of 2H $MoS_2$, five different Raman peaks (148 $cm^{-1}$, 206 $cm^{-1}$, 277 $cm^{-1}$, 323 cm-1 and 403 cm-1) are observed from the 1T' $MoS_2$ region. The angle-dependent Raman intensities of 2H $MoS_2$ (FIG. 11A) and 1T' $MoS_2$ (FIG. 11B) also exhibit clear differences, since 2H $MoS_2$ monolayer displays no angle dependence.

Figure 12:
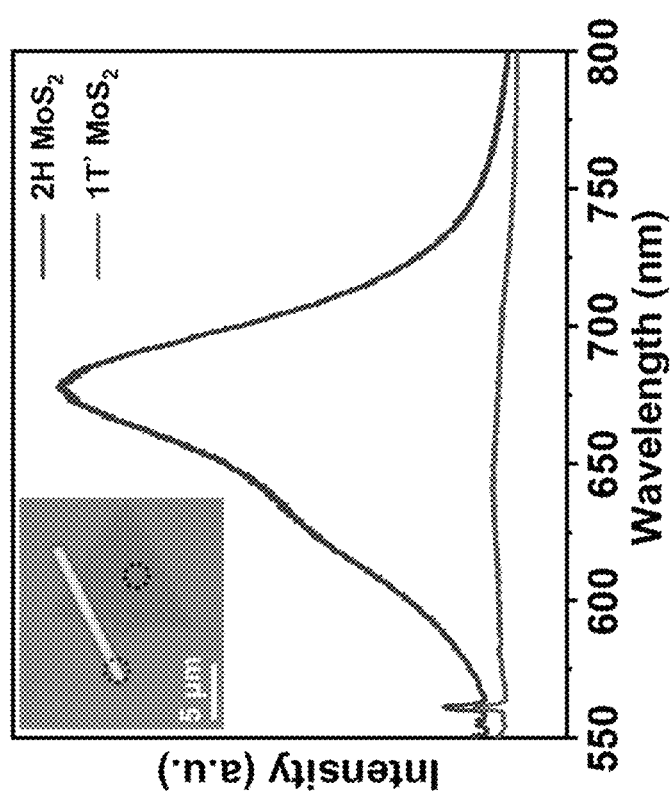
FIG. 12 shows photoluminescence (PL) spectra of 2H MoS$_2$ and 1T' MoS$_2$ regions respectively.

The photoluminescence (PL) spectra of 1T' $MoS_2$ and 2H $MoS_2$ are shown in FIG. 12. 1T' $MoS_2$ shows a metallic property without absorption peaks while 2H $MoS_2$ presents a semiconducting feature with a strong sharp exciton peak at 677 nm, which is a typical PL characteristic spectrum of monolayer $MoS_2$.

Figure 13A:
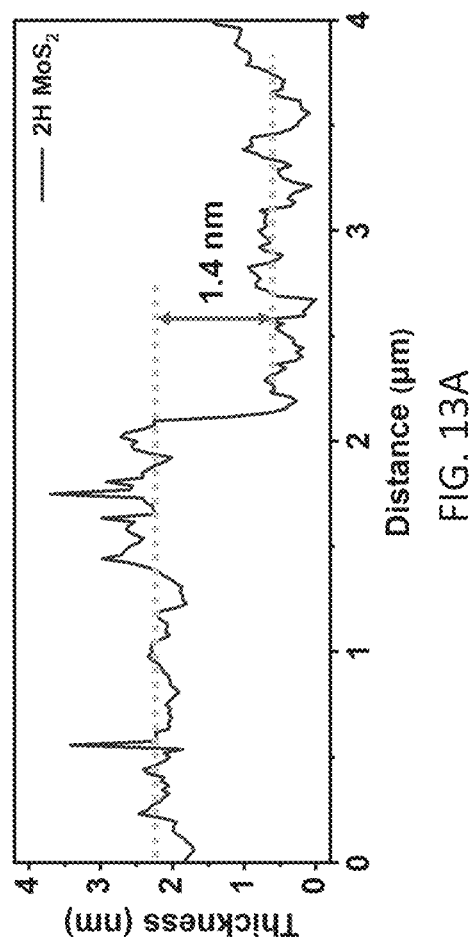
FIGS. 13A and 13B show thickness measurement results of 2H MoS$_2$ and 1T' MoS$_2$ regions respectively.
Figure 13B:
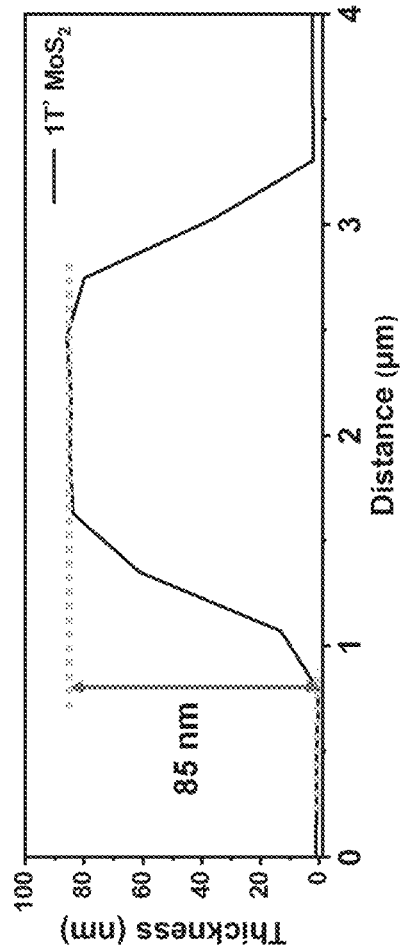
Figure 14:
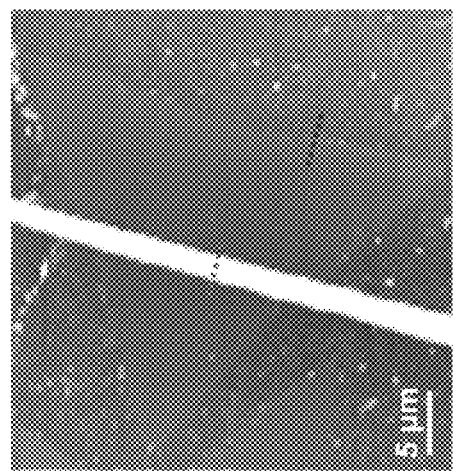
FIG. 14 shows the atomic force microscope (AFM) image of the 2H/1T' MoS$_2$ heterophase junctions.

FIGS. 13A and 13B show thickness measurement results of 1T' $MoS_2$ and 2H $MoS_2$ regions respectively. Combined with the atomic force microscope (AFM) image (FIG. 14) and the distance between the two typical Raman peaks of 2H $MoS_2$, it can be further proved that the CVD-grown 2H $MoS_2$ is monolayer.

Figure 15B:
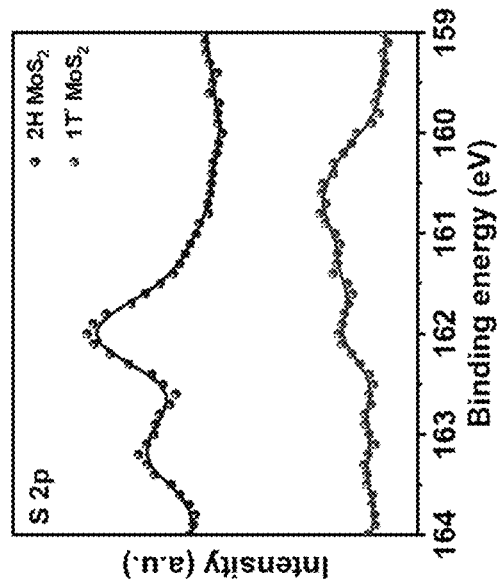
FIGS. 15A and 15B show micro-zone X-ray photoelectron spectroscopy (XPS) spectra of the Mo 3d and S 2p orbits of the 2H MoS$_2$ and 1T' MoS$_2$ regions among the 2H/1T' MoS$_2$ heterophase junctions respectively.
Figure 15A:
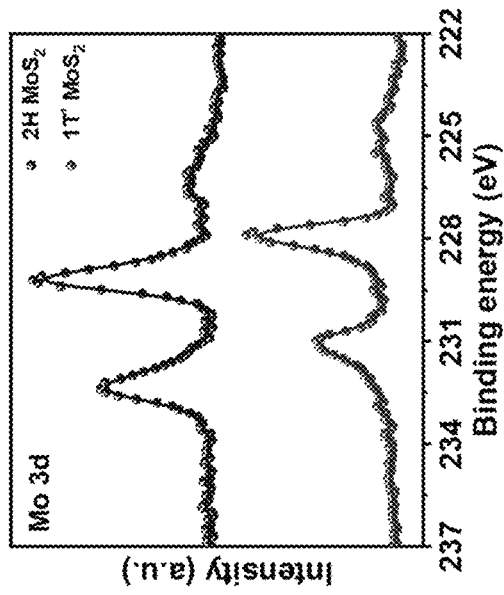
Figure 16A:
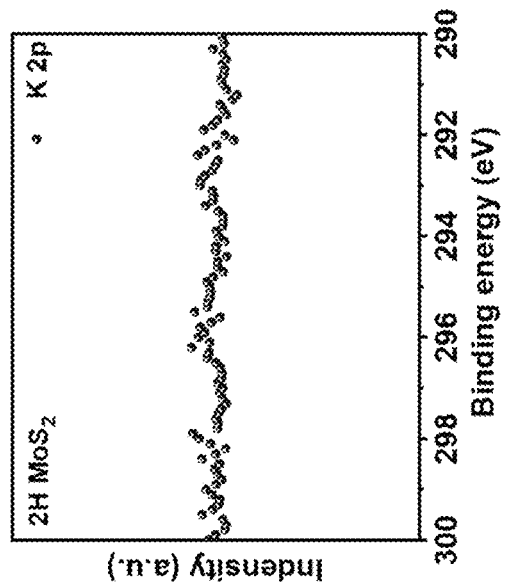
FIGS. 16A and 16B show XPS spectra of the K 2p orbits of the 2H MoS$_2$ and 1T' MoS$_2$ regions respectively.
Figure 16B:
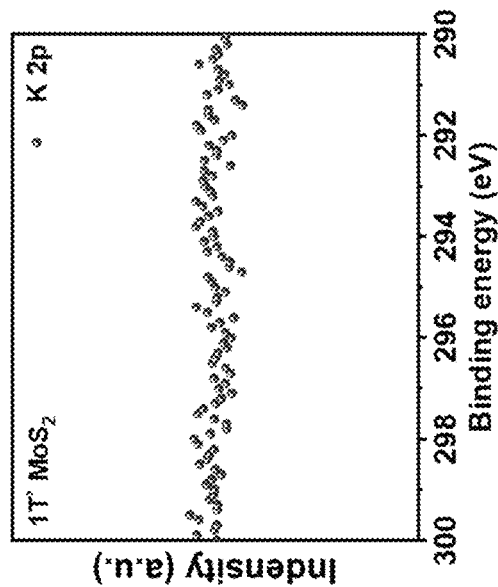
Figure 17B:
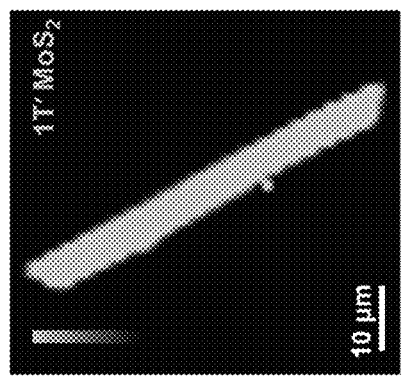
FIGS. 17A and 17B show Raman mapping images of the 2H MoS$_2$ and 1T' MoS$_2$ regions respectively.
Figure 17A:
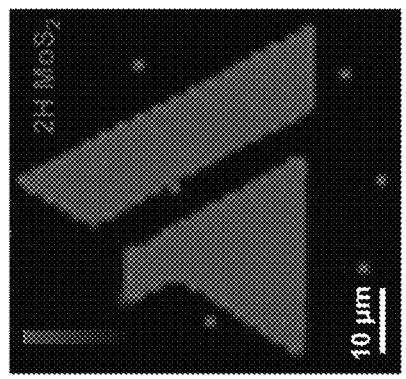
Figure 18:
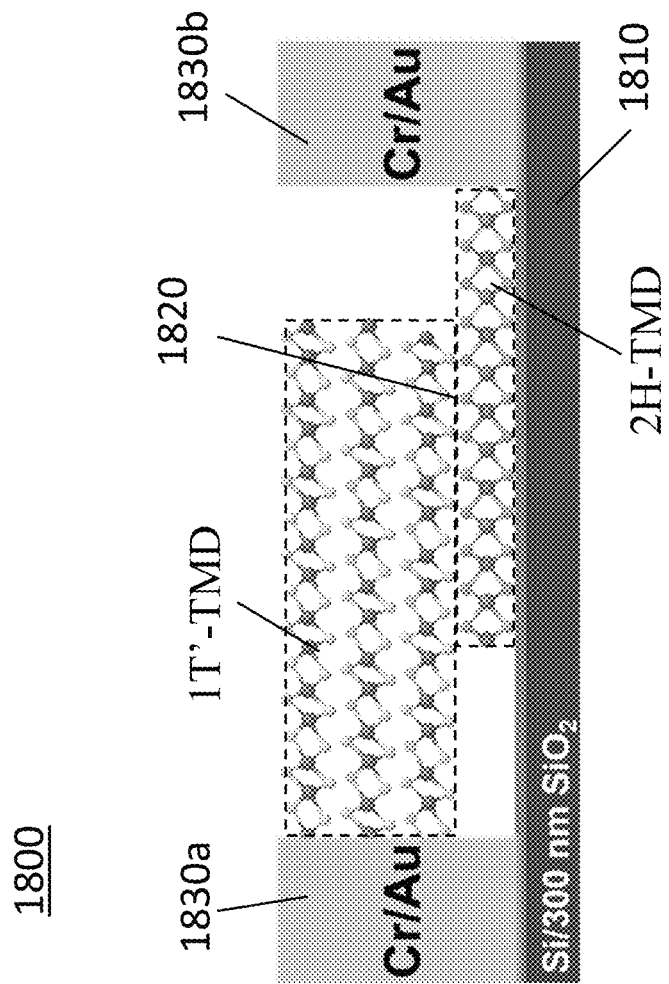
FIG. 18 shows schematic diagram of a heterophase junction device based on 2H/1T' TMD heterophase junctions according to some embodiments of the present invention.

FIGS. 15A and 15B show micro-zone X-ray photoelectron spectroscopy (XPS) spectra of the Mo 3d and S 2p orbits of the 2H $MoS_2$ and 1T' $MoS_2$ regions among the 2H/1T' $MoS_2$ heterophase junctions respectively. FIGS. 16A and 16B show XPS spectra of the K 2p orbits of the 2H MoS$_2$ and 1T' MoS$_2$ regions respectively. The Mo 3d peaks of 1T'-MoS$_2$ located at 227.9 and 231 eV correspond to 3d$_{5/2}$ and 3d$_{3/2}$ orbits, respectively, whereas the Mo 3d peaks of 2H MoS$_2$ shift to higher binding energies (229.2 and 232.4 eV). A similar offset is also observed in the binding energy of the S 2p orbits. Besides, no K 2p signal is detected, indicating the complete removal of K in the synthesized heterophase junctions. The uniform signals in the Raman mapping images of the 2H MoS$_2$ (FIG. 17A) and the 1T' MoS$_2$ (FIG. 17B) demonstrate the high crystalline quality and phase purity of the as-prepared junctions.

Fabrication of 2H/1T' MoS$_2$ Heterophase Junction-Based Device

As large-scale 1T' MoS$_2$ nanoribbon can be grown beyond the region of 2H MoS$_2$, directly fabricating devices is allowed by using the as-prepared heterophase junctions without additional post-processing steps.

In one embodiment, to fabricate a 2H/1T' MoS$_2$ heterophase junction-based device, a 2H/1T' MoS$_2$ heterophase junction as grown by the synthetic method provided by the present invention was transferred onto a Si/SiO$_2$ substrate. Firstly, the fluorophlogopite mica substrate grown with 2H/1T' MoS$_2$ heterophase junctions was coated with poly (methyl methacrylate) (PMMA 495, A8, Microchem) at 4000 r.p.m for 40 s, followed by baking at 80° C. for 30 mins on a hotplate. Then the mica was soaked in deionized water. After the PMMA film dropped out from the mica substrate, the film was scooped up by a freshly cleaned 300-nm-thick SiO$_2$/Si substrate and baked at 80° C. for 10 mins on a hotplate to promote the adhesion of 2H/1T' MoS$_2$ heterophase junctions on the SiO$_2$/Si substrate. The PMMA was removed by soaking the substrate in acetone for 20 min and the 2H/1T' MoS$_2$ heterophase junctions were left on the SiOy/Si substrate. Finally, Cr (8 nm)/Au (32 nm) electrodes were fabricated on the as-synthesized monolayer crystals by employing typical lithography procedures.

Characterization of 2H/1T' MoS$_2$ Heterophase Junction-Based Device

Figure 20:
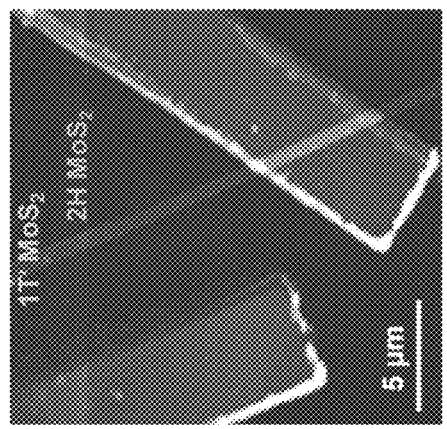
FIG. 20 shows the corresponding AFM image of the 2H/1T' MoS$_2$ heterophase junction device.
Figure 19:
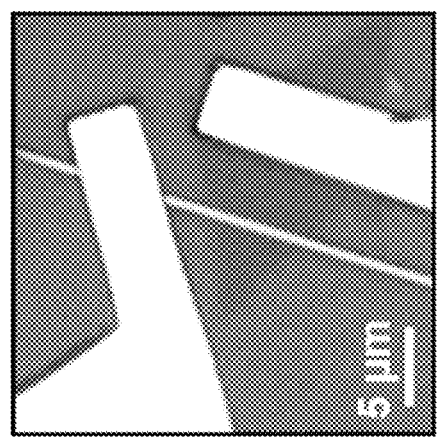
FIG. 19 shows a typical optical image of the 2H/1T' MoS$_2$ heterophase junction device respectively.
Figure 21B:
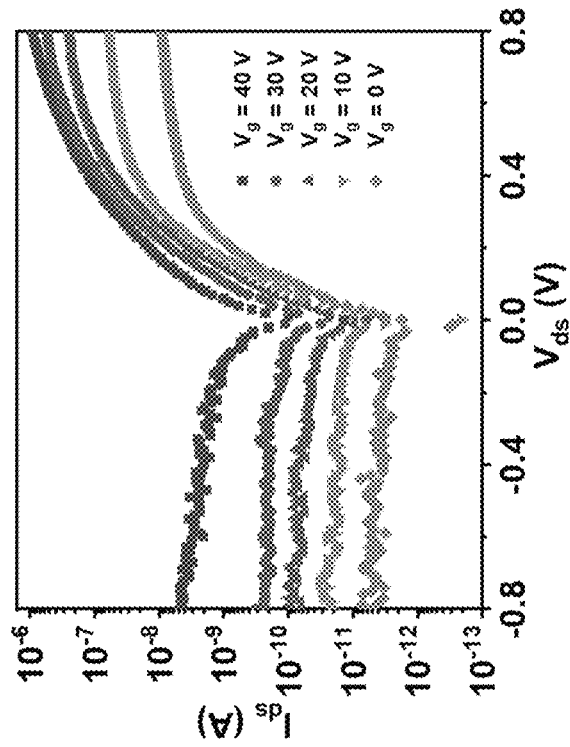
FIG. 21A shows the transfer curve and FIG. 21B shows $I_{ds}$-$V_{ds}$ characteristic curves under different gate voltages of the 2H/1T' MoS$_2$ heterophase junction device.
Figure 21A:
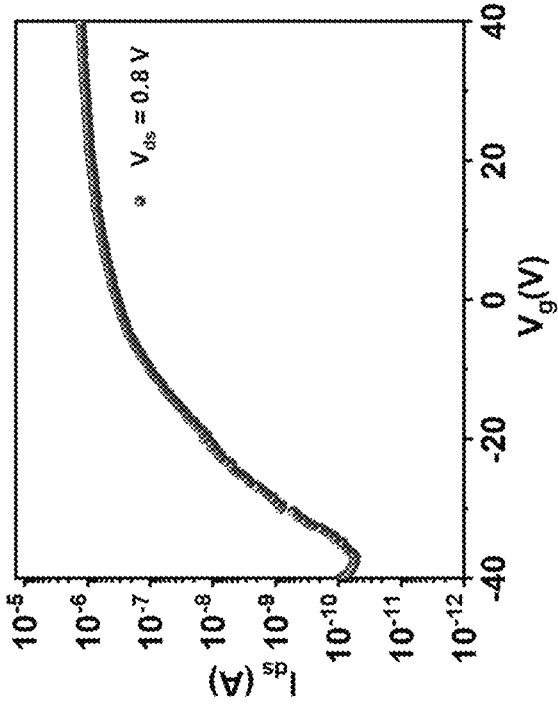

FIG. 19 shows a typical optical image of the 2H/1T' MoS$_2$ heterophase junction-based device. The corresponding AFM image in FIG. 20 reveals that the device has a clean surface. The transfer curve of the device in FIG. 21A presents a typical semiconducting n-type behavior with an on-off ratio of about 105. The output characteristics ($I_{ds}$-$V_{ds}$) under different gate voltages in FIG. 21B reveal that the las increases gradually with the Vg varying from 0 to 40 V.

Figure 22B:
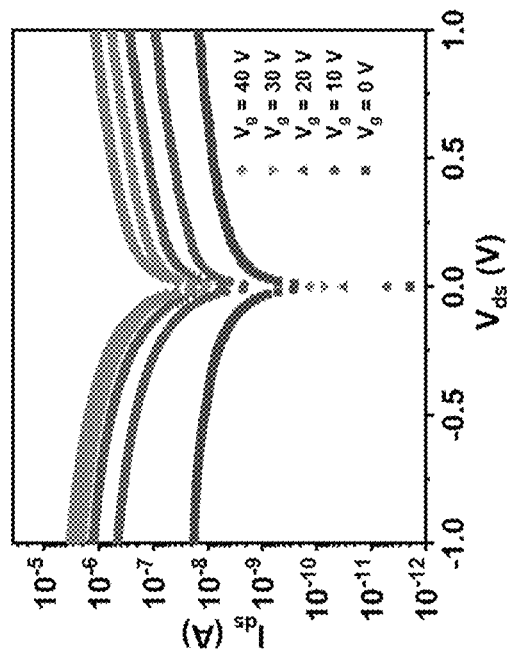
FIG. 22A shows the transfer curve and FIG. 22B shows $I_{ds}$-$V_{ds}$ characteristic curves under different gate voltages of a comparative 2H MoS$_2$ device.
Figure 22A:
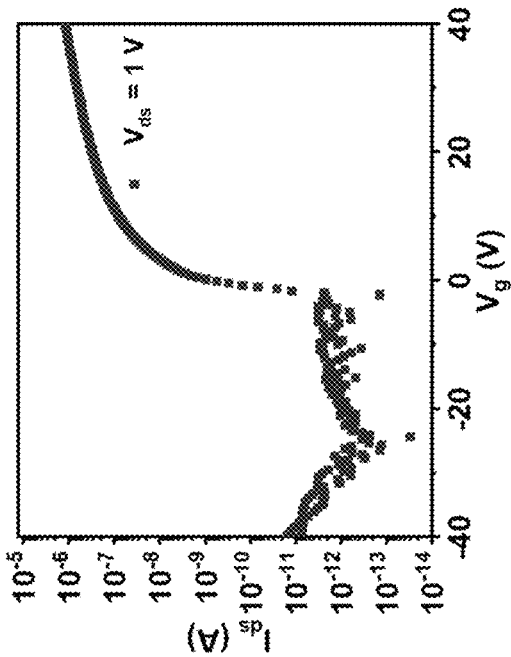

It is worth noting that the transfer curve and gate-tunable output curves of the 2H/1T' MoS$_2$ heterophase junction-based device also exhibit prominent current rectification behavior in comparison with those of pure 2H MoS$_2$ (FIGS. 22A and 22B), further confirming the formation of Schottky junction across the interface of 1T' and 2H MoS$_2$.

Figure 23A:
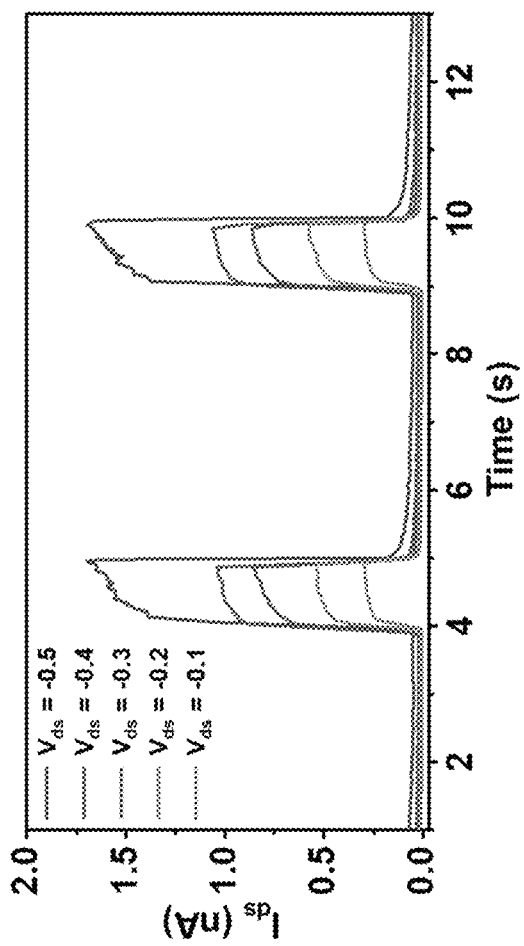
FIG. 23A shows curves of time-resolved photocurrents of the 2H/1T' MoS$_2$ heterophase junction device at different Vas biases under a 532 nm laser with 3.52 mW/cm$^2$ input power.
Figure 23B:
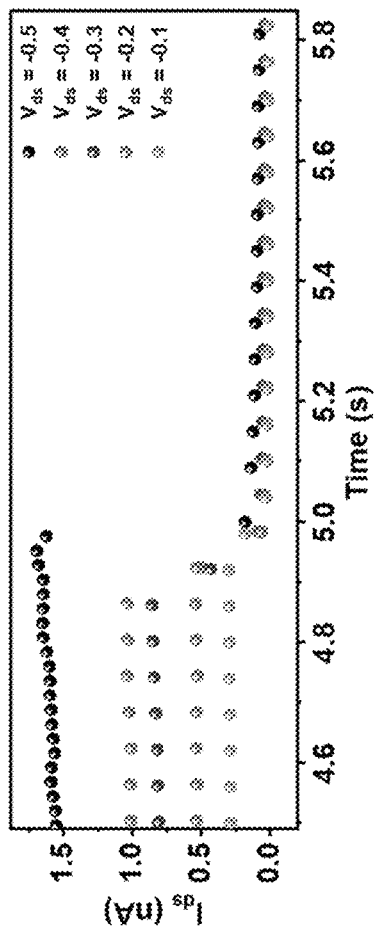
FIG. 23B show a close-up view of the curves of FIG. 23A.
Figure 24:
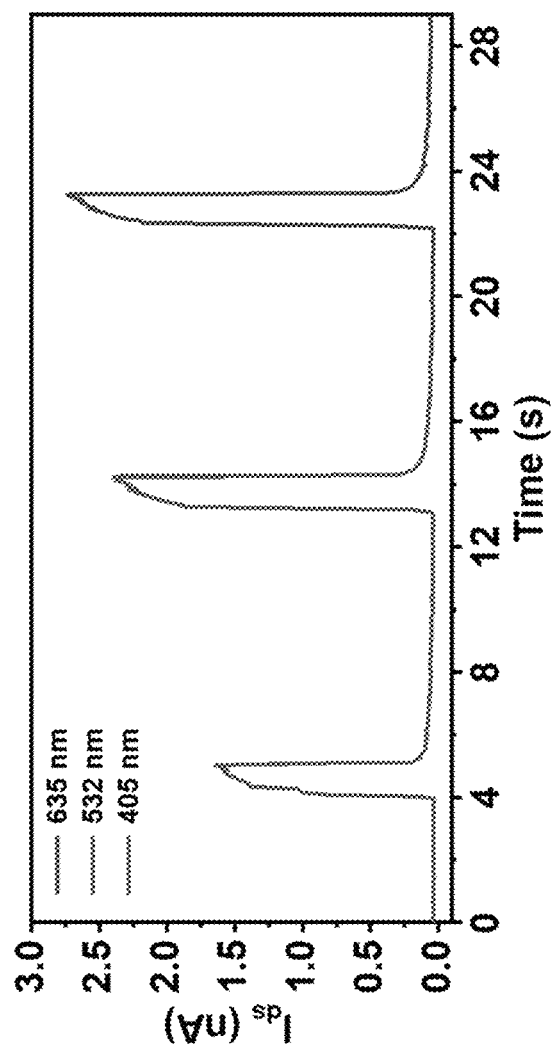
FIG. 24 show photo-switching characteristics of the 2H/1T' MoS$_2$ heterophase junction device for different wavelengths.

In addition, benefiting from the Schottky junction, the device shows a good optoelectronic performance. Under negative drain-source bias and gate voltage, an ultralow dark current at an order of 10-11 A is achieved. FIG. 23A shows the time-resolved photocurrents of the device at different Vas biases under a 532 nm laser with 3.52 mW/cm$^2$ input power. The photocurrent increases gradually with the increase of the drain-source voltage, and a high responsivity of 1.07 A/W is realized under-0.5 V drain-source bias. It can also be seen from FIG. 23A that the photocurrent rises rapidly under laser irradiation, and then decays sharply when the laser is turned off in all curves. The falling time is less than 24 ms (see FIG. 23B) which is limited by the resolution of our measurement equipments. In addition, referring to the photo-switching characteristics as shown in FIG. 24, for different wavelengths, the device also shows high responsivity and fast response time. These inspiring results highlight the promising potential of 2H/1T' MoS$_2$ heterophase junction phototransistors in practical applications The embodiments may be chosen and described in order to best explain the principles of the invention and its practical application, thereby enabling others skilled in the art to understand the invention for various embodiments and with various modifications that are suited to the particular use contemplated. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations. While the apparatuses disclosed herein have been described with reference to particular structures, shapes, materials, composition of matter and relationships . . . etc., these descriptions and illustrations are not limiting. Modifications may be made to adapt a particular situation to the objective, spirit and scope of the present disclosure. All such modifications are intended to be within the scope of the claims appended hereto.

The invention claimed is:

1. A method for synthesizing 2H/1T' transition metal dichalcogenide (TMD) heterophase junctions, comprising:
   mixing a transition metal compound powder and a first chalcogen powder to form a first mixture;
   heating up the first mixture to a first heating temperature in a chemical vapour deposition (CVD) furnace filled with Ar gas;
   keeping the first mixture at the first heating temperature for a first heating time under a first mixed gas flow of H$_2$ and Ar to form a first precursor;
   mixing the first precursor with a second chalcogen powder to form a second mixture;
   heating up the second mixture to a second heating temperature in a CVD furnace filled with Ar gas;
   keeping the second mixture at the second heating temperature for a second heating time under a second mixed gas flow of H$_2$ and Ar to form a second precursor;
   placing a substrate on top of the second precursor;
   heating up the second precursor and the substrate to a growth temperature in a CVD furnace filled with Ar gas;
   keeping the second precursor and the substrate at the growth temperature for a first growth time under a gas flow of Ar to grow a 2H TMD layer on the substrate;
   keeping the second precursor and the substrate at the growth temperature for a second growth time under a third mixed gas flow of H$_2$ and Ar to grow a 1T' TMD layer above the grown 2H TMD layer on the substrate; and
   cooling down rapidly the substrate grown with the 2H/1T' TMD heterophase junctions.

2. The method of claim 1, further comprising grinding the first mixture in an agate mortar, transferring the first mixture into a first alumina crucible and placing the first alumina crucible at a center position in the CVD furnace before heating up the first mixture in the CVD furnace.

3. The method of claim 1, further comprising transferring the second mixture into a second alumina crucible and placing the second alumina crucible at a center position in the CVD furnace before heating up the second mixture in the CVD furnace.

4. The method of claim 1, further comprising transferring the second precursor into a quartz crucible before the substrate being placed on top of the second precursor and placing the quartz crucible at a center position in the CVD furnace before heating up the third mixture in the CVD furnace.

5. The method of claim 1, wherein the substrate is a fluorophlogopite mica substrate or a sapphire substrate.

6. The method of claim 1, wherein
a flow rate ratio for $H_2$ to Ar in the first mixed gas flow is equal to 1:9; and
the first heating temperature ranges from 400 to 500° C. and the first heating time ranges from 1 to 2 hours.

7. The method of claim 1, wherein
a flow rate ratio for $H_2$ to Ar in the second mixed gas flow is equal to 1:9; and
the second heating temperature ranges from 400 to 500° C. and the second heating time ranges from 1 to 2 hours.

8. The method of claim 1, wherein
a flow rate ratio for $H_2$ to Ar in the third mixed gas flow is equal to 2:8; and
the growth temperature ranges from 750 to 800° C. and each of the first and second growth times ranges from 4 to 6 minutes.

9. The method of claim 1, wherein the transition metal compound powder is a molybdenum compound powder and both the first and second chalcogen powders are sulfur powders such that the 2H/1T' TMD heterophase junctions grown on the substrate are 2H/1T' molybdenum disulfide heterophase junctions.

10. The method of claim 9, wherein the molybdenum compound powder is a potassium molybdate ($K_2MoO_4$) powder.

11. A 2H/1T' transition metal dichalcogenide (TMD) heterophase junction-based device, comprising:
a substrate;
a 2H/1T' TMD heterophase junction deposited on the substrate and including a 1T'-TMD region and a 2H-TMD region; and
a pair of electrodes connected to the 1T'-TMD and the 2H-TMD regions respectively.

12. The 2H/1T' TMD heterophase junction-based device of claim 11, wherein the 1T'-TMD region is formed of 1T'-$MoS_2$ crystal and the 2H-TMD region is formed of 2H-$MoS_2$ crystal.

13. The 2H/1T' $MoS_2$ heterophase junction-based device of claim 11, wherein the substrate is a $SiO_2$/Si substrate.

14. The 2H/1T' $MoS_2$ heterophase junction-based device of claim 11, wherein the electrodes are made of Cr/Au layer.

* * * * *